US012563813B2

(12) United States Patent     (10) Patent No.:   US 12,563,813 B2

Yoshimura et al.     (45) Date of Patent:    Feb. 24, 2026

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Takashi Yoshimura, Matsumoto (JP); Makoto Shimosawa, Matsumoto (JP); Motoyoshi Kubouchi, Matsumoto (JP); Misaki Uchida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 323 days.

(21) Appl. No.: 18/172,347

(22) Filed: Feb. 22, 2023

(65) Prior Publication Data

US 2023/0317812 A1     Oct. 5, 2023

(30) Foreign Application Priority Data

Mar. 30, 2022    (JP) ................................. 2022-055064

(51) Int. Cl.
    H10D 64/62      (2025.01)
    H01L 21/22      (2006.01)
        (Continued)

(52) U.S. Cl.
    CPC ........... H10D 64/62 (2025.01); H01L 21/221 (2013.01); H01L 21/28518 (2013.01);
        (Continued)

(58) Field of Classification Search
None
See application file for complete search history.

(56) References Cited

U.S. PATENT DOCUMENTS 6,498,091 B1 *   12/2002   Chen ................. H01L 21/28556
                                      438/653
2006/0148238 A1 *   7/2006   Kim .................... H01L 21/2855
                                      438/627

(Continued)

FOREIGN PATENT DOCUMENTS

JP        H053171 A     1/1993
JP      2007335554 A    12/2007

(Continued)

OTHER PUBLICATIONS

Office Action issued for counterpart Japanese Application No. 2022-055064, transmitted from the Japanese Patent Office on Jan. 6, 2026.

*Primary Examiner* — Xiaoming Liu

(57)           ABSTRACT

Provided is a semiconductor device including a MOS gate structure provided in a semiconductor substrate, including: an interlayer dielectric film which includes a contact hole and is provided above the semiconductor substrate; a conductive first barrier metal layer provided on side walls of the interlayer dielectric film in the contact hole; a conductive second barrier metal layer stacked on the first barrier metal layer in the contact hole; and a silicide layer provided on an upper surface of the semiconductor substrate below the contact hole, in which the first barrier metal layer is more dense than the second barrier metal layer, and a film thickness thereof is 1 nm or more and 10 nm or less.

19 Claims, 10 Drawing Sheets

(51) Int. Cl.

| | | |
|---|---|---|
| *H01L 21/285* | (2006.01) | |
| *H10D 12/00* | (2025.01) | |
| *H10D 62/53* | (2025.01) | |
| *H10D 64/00* | (2025.01) | |
| *H10D 84/60* | (2025.01) | |

(52) U.S. Cl.
CPC ........... *H10D 12/481* (2025.01); *H10D 62/53* (2025.01); *H10D 64/117* (2025.01); *H10D 84/617* (2025.01)

(56) References Cited

U.S. PATENT DOCUMENTS

| | | | |
|---|---|---|---|
| 2008/0124915 A1 | 5/2008 | Yamaguchi | |
| 2018/0261495 A1* | 9/2018 | Yang .................. | H01L 21/76232 |
| 2019/0067098 A1* | 2/2019 | Kumar .............. | H01L 23/53266 |
| 2020/0020579 A1 | 1/2020 | Kato | |
| 2020/0051852 A1 | 2/2020 | Suzawa | |
| 2020/0075752 A1* | 3/2020 | Shimosawa .......... | H10D 62/393 |
| 2020/0105745 A1 | 4/2020 | Obata | |
| 2021/0043758 A1* | 2/2021 | Yokoyama .............. | H10D 8/00 |

FOREIGN PATENT DOCUMENTS

| | | |
|---|---|---|
| JP | 2018014392 A | 1/2018 |
| JP | 2020013828 A | 1/2020 |
| JP | 2021192447 A | 12/2021 |
| WO | 2019093015 A1 | 5/2019 |

* cited by examiner

100

54

62  61

53

65

38          64          38

21

63          N+          12

P−

14

44  42          32  34

40          30

START

FORM FRONT SURFACE SIDE ELEMENT STRUCTURE    ～S100

FORM INTERLAYER DIELECTRIC FILM 38    ～S102

FORM CONTACT HOLES    ～S104

DEPOSIT INITIAL METAL FILM    ～S106

ANNEAL    ～S108

ETCH TiN FILM    ～S110

DEPOSIT SECOND BARRIER METAL LAYER 62    ～S112

ANNEAL    ～S114

FORM PLUG LAYER 64    ～S116

ETCH BACK PLUG LAYER 64    ～S118

END

SEMICONDUCTOR DEVICE AND METHOD OF MANUFACTURING SEMICONDUCTOR DEVICE

The contents of the following Japanese patent application(s) are incorporated herein by reference:

NO. 2022-055064 filed in JP on Mar. 30, 2022

BACKGROUND

1. Technical Field

The present invention relates to a semiconductor device and a method of manufacturing a semiconductor device.

2. Related Art

Patent Document 1 describes a semiconductor device in which a "contact hole" is provided with a barrier film such as a "titanium layer".

PRIOR ART DOCUMENTS

Patent Documents

Patent Document 1: Japanese Patent Application Publication No. H05-003171

Patent Document 2: Japanese Patent Application Publication No. 2007-335554

DESCRIPTION OF EXEMPLARY EMBODIMENTS

Hereinafter, an embodiment of the present invention will be described, but the embodiment does not limit the invention according to the claims. In addition, not all combinations of features described in the embodiment are essential to the solution of the invention.

As used herein, one side in a direction parallel to a depth direction of a semiconductor substrate is referred to as "upper" and the other side is referred to as "lower". One surface of two principal surfaces of a substrate, a layer, or other members is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It is to be noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, the axis perpendicular to the upper surface and the lower surface of the semiconductor substrate is referred to as the Z axis. In the present specification, the direction of the Z axis may be referred to as the depth direction. In addition, as used in the present specification, a direction parallel to the upper surface and the lower surface of the semiconductor substrate, including the X axis and the Y axis, may be referred to as a horizontal direction.

In the present specification, a description of a P+ type or an N+ type means a higher doping concentration than the P type or the N type, and a description of a P− type or an N− type means a lower doping concentration than the P type or the N type.

Figure 1A:
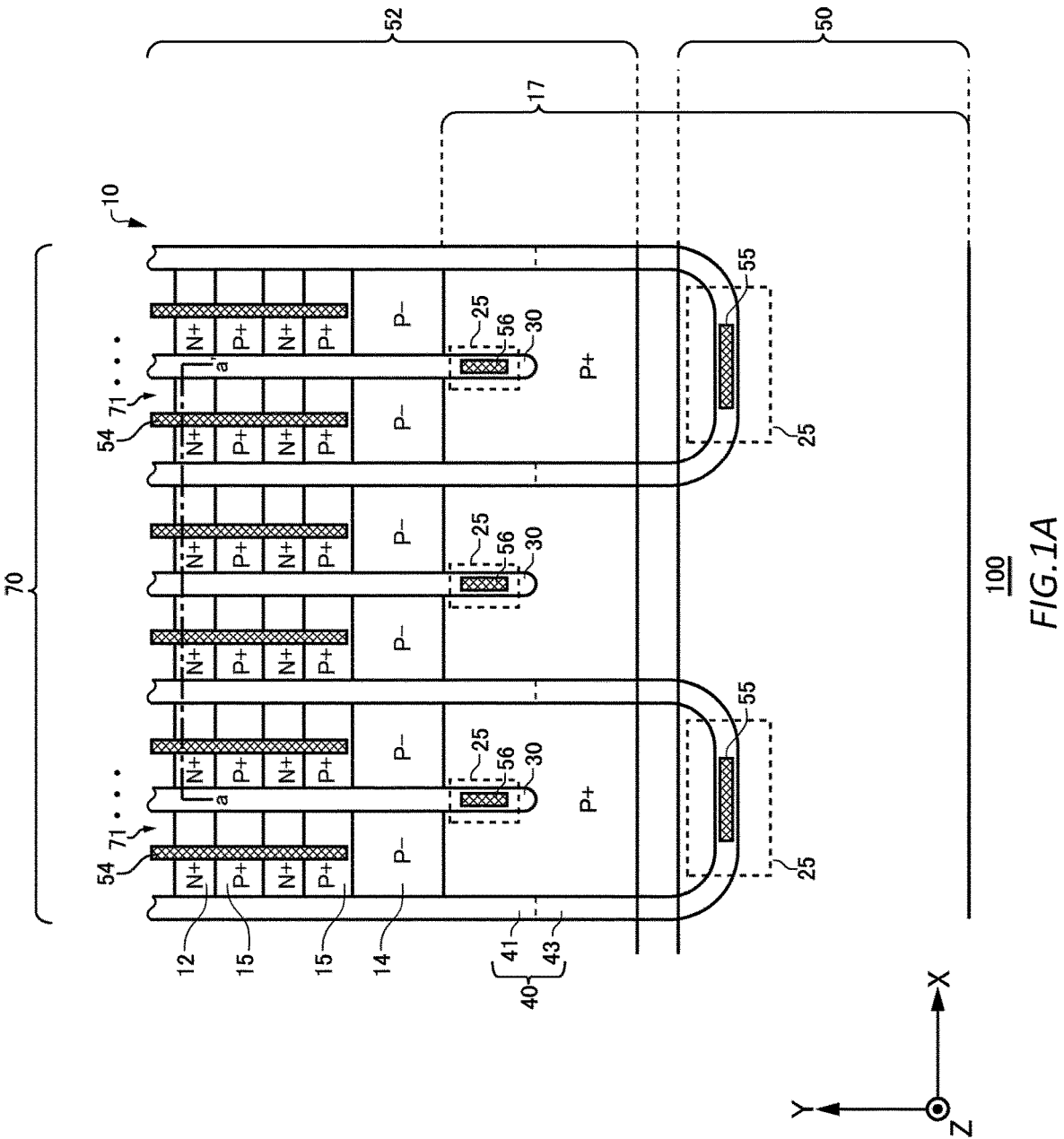
FIG. 1A shows an example of a top view of a semiconductor device 100.
Figure 1B:
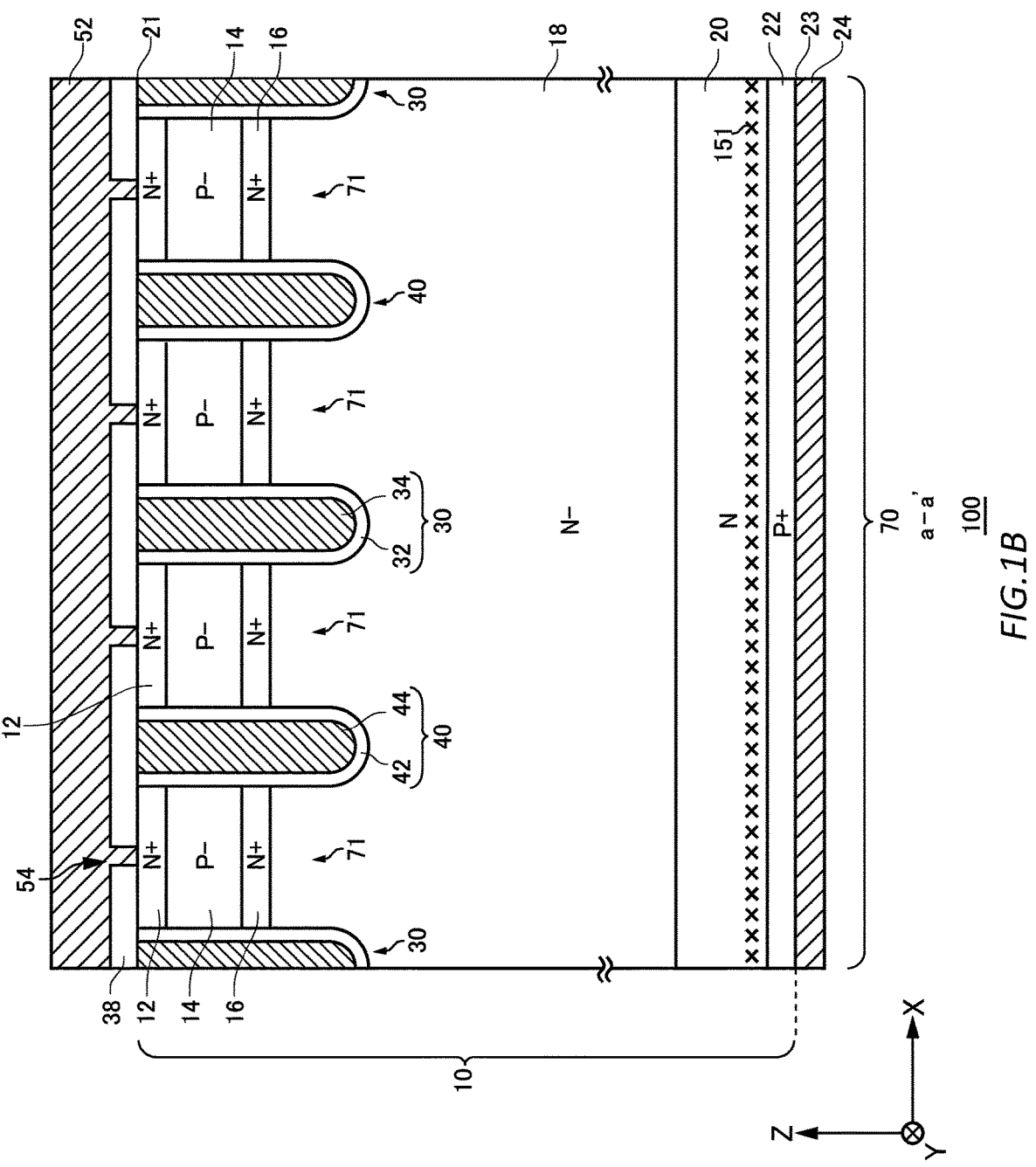
FIG. 1B shows an example of a cross section a-a' in FIG. 1A.

FIG. 1A shows an example of a top view of a semiconductor device 100. The semiconductor device 100 of the present example is a semiconductor chip that includes a transistor portion 70. The semiconductor device 100 is not limited to a transistor as long as it is a semiconductor element in which a semiconductor substrate 10 has a MOS gate structure.

The transistor portion 70 is a region obtained by projecting a collector region 22 provided on a back surface side of the semiconductor substrate 10 onto an upper surface of the semiconductor substrate 10. The collector region 22 will be described later. The transistor portion 70 includes a transistor such as an IGBT. In the present example, the transistor portion 70 is an IGBT. It is to be noted that the transistor portion 70 may be other transistors such as a MOSFET.

The present figure shows a surrounding region of a chip end portion on an edge side of the semiconductor device 100, and other regions are omitted. For example, an edge termination structure portion may be provided in a region on a negative side of the Y axis direction in the semiconductor device 100 of the present example. The edge termination structure portion relaxes an electric field strength on the upper surface side of the semiconductor substrate 10. The edge termination structure portion includes, for example, a guard ring, a field plate, a RESURF, and a combined structure thereof. It is to be noted that although the present example describes the edge on the negative side of the Y axis direction for convenience, the same applies to other edges of the semiconductor device 100.

The semiconductor substrate 10 is a substrate formed of a semiconductor material. The semiconductor substrate 10 may be a silicon substrate or may be a silicon carbide substrate. The semiconductor substrate 10 of the present example is a silicon substrate. It is to be noted that when referred to as a top view in the present specification, it means that the upper surface side of the semiconductor substrate 10 is viewed from above. As will be described later, the semiconductor substrate 10 includes a front surface 21 and a back surface 23.

The semiconductor device 100 of the present example includes, on the front surface 21 of the semiconductor substrate 10, a gate trench portion 40, a dummy trench portion 30, an emitter region 12, a base region 14, a contact region 15, and a well region 17. In addition, the semiconductor device 100 of the present example includes an emitter electrode 52 and a gate metal layer 50 provided above the front surface 21 of the semiconductor substrate 10. The emitter electrode 52 and the gate metal layer 50 are an example of a front surface side metal layer 53 to be described later. The gate trench portion 40 is an example of the MOS gate structure provided in the semiconductor device 100. It is to be noted that although the semiconductor device 100 of the present example is a transistor including the MOS gate structure, the semiconductor device 100 may alternatively be a diode including the MOS gate structure.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17.

The emitter electrode 52 and the gate metal layer 50 are formed of a material including metal. At least a partial region of the emitter electrode 52 may be formed of metal such as aluminum (Al) or a metal alloy such as an aluminum-silicon alloy (AlSi) and an aluminum-silicon-copper alloy (AlSiCu). At least a partial region of the gate metal layer 50 may be formed of metal such as aluminum (Al) or a metal alloy such as an aluminum-silicon alloy (AlSi) and an aluminum-silicon-copper alloy (AlSiCu). The emitter electrode 52 and the gate metal layer 50 may include a barrier metal layer formed of titanium, a titanium compound, or the like under the region formed of aluminum and the like. The barrier metal layer will be described later. The emitter electrode 52 and the gate metal layer 50 are provided separate from each other.

The emitter electrode 52 and the gate metal layer 50 are provided above the semiconductor substrate 10 with an interlayer dielectric film 38 interposed therebetween. The interlayer dielectric film 38 is omitted in FIG. 1A. The interlayer dielectric film 38 is provided with contact holes 54, contact holes 55, and contact holes 56 penetrating therethrough.

The contact hole 55 connects the gate metal layer 50 and a gate conductive portion in the transistor portion 70. A plug layer formed of tungsten or the like may be formed inside the contact hole 55. The plug layer will be described later.

The contact hole 56 connects the emitter electrode 52 and a dummy conductive portion in the dummy trench portion 30. A plug layer formed of tungsten or the like may be formed inside the contact hole 56.

A connection portion 25 is connected to a front surface side metal layer 53 such as the emitter electrode 52 or the gate metal layer 50. In one example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. The connection portion 25 of the present example is polysilicon doped with an N type impurity (N+). The connection portion 25 is provided above the front surface 21 of the semiconductor substrate 10 via a dielectric film such as an oxide film, or the like.

The gate trench portions 40 are an example of a plurality of trench portions extending in a predetermined extending direction on the front surface 21 side of the semiconductor substrate 10. The gate trench portions 40 are arrayed at predetermined intervals along a predetermined array direction (the X axis direction in the present example). The gate trench portion 40 of the present example may include: two extending portions 41 extending along an extending direction (the Y axis direction in the present example) which is parallel to the front surface 21 of the semiconductor substrate 10 and is perpendicular to the array direction; and a connecting portion 43 which connects the two extending portions 41.

Preferably, at least a part of the connecting portion 43 is formed in a curved shape. By connecting end portions of the two extending portions 41 of the gate trench portion 40, an electric field strength at the end portions of the extending portions 41 can be relaxed. At the connecting portion 43 of the gate trench portion 40, the gate metal layer 50 may be connected to the gate conductive portion.

The dummy trench portions 30 are an example of the plurality of trench portions extending in the predetermined extending direction on the front surface 21 side of the semiconductor substrate 10. The dummy trench portion 30 is a trench portion that is electrically connected to the emitter electrode 52. Similar to the gate trench portions 40, the dummy trench portions 30 are arrayed at predetermined intervals along a predetermined array direction (the X axis direction in the present example). Although the dummy trench portion 30 of the present example has an I shape on the front surface 21 of the semiconductor substrate 10, it may have a U shape on the front surface 21 of the semiconductor substrate 10 similar to the gate trench portion 40. That is, the dummy trench portion 30 may include two extending portions extending along the extending direction and a connecting portion which connects the two extending portions.

The transistor portion 70 of the present example has a structure in which two gate trench portions 40 and two dummy trench portions 30 are arrayed repetitively. That is, the transistor portion 70 of the present example includes the gate trench portions 40 and the dummy trench portions 30 at a ratio of 1:1. For example, the transistor portion 70 includes one dummy trench portion 30 between two extending portions 41.

It is to be noted that the ratio between the gate trench portions 40 and the dummy trench portions 30 is not limited to the present example. The ratio of the gate trench portions 40 may be larger than the ratio of the dummy trench portions 30, or the ratio of the dummy trench portions 30 may be larger than the ratio of the gate trench portions 40. The ratio between the gate trench portions 40 and the dummy trench portions 30 may be 2:3 or may be 2:4. Alternatively, with all trench portions being the gate trench portions 40, the transistor portion 70 does not need to include the dummy trench portion 30.

The well region 17 is a region of a second conductivity type, which is provided closer to the front surface 21 of the semiconductor substrate 10 than a drift region 18 to be described later. The well region 17 is an example of a well region provided on the edge side of the semiconductor device 100. As an example, the well region 17 is of the P+ type. The well region 17 is formed within a predetermined range from an end portion of an active region on a side on which the gate metal layer 50 is provided. The well region 17 may have a diffusion depth larger than the depths of the gate trench portion 40 and the dummy trench portion 30.

Partial regions of the gate trench portion 40 and the dummy trench portion 30 on the gate metal layer 50 side are formed in the well region 17. Bottoms of ends of the gate trench portion 40 and the dummy trench portion 30 in the extending direction may be covered by the well region 17.

The contact hole 54 is formed above each region of the emitter region 12 and the contact region 15 in the transistor portion 70. The contact hole 54 is not provided above the well regions 17 provided at both ends in the Y axis direction. In this manner, one or more contact holes 54 are formed in the interlayer dielectric film. The one or more contact holes 54 may be provided so as to extend in the extending direction.

A mesa portion 71 is a mesa portion provided in direct contact with the trench portion in a plane parallel to the front surface 21 of the semiconductor substrate 10. The mesa portion is a portion of the semiconductor substrate 10 sandwiched between two trench portions adjacent to each other, and may be a portion ranging from the front surface 21 of the semiconductor substrate 10 to a depth of a lowermost bottom portion of each trench portion. The extending portions of each trench portion may be set to be one trench portion. That is, the region sandwiched between two extending portions may be set to be a mesa portion.

The mesa portion 71 is provided in direct contact with at least one of the dummy trench portion 30 or the gate trench portion 40 in the transistor portion 70. The mesa portion 71 includes the well region 17, the emitter region 12, the base region 14, and the contact region 15 on the front surface 21 of the semiconductor substrate 10. In the mesa portion 71, the emitter region 12 and the contact region 15 are provided alternately in the extending direction.

The base region 14 is a region of a second conductivity type, which is provided on the front surface 21 side of the semiconductor substrate 10. As an example, the base region 14 is of the P− type. The base region 14 may be provided at both end portions of the mesa portion 71 in the Y axis direction on the front surface 21 of the semiconductor substrate 10. It is to be noted that FIG. 1A shows only one end portion of the base region 14 in the Y axis direction.

The emitter region 12 is a region of a first conductivity type, which has a higher doping concentration than the drift region 18. As an example, the emitter region 12 of the present example is of the N+ type. An example of a dopant of the emitter region 12 is arsenic (As). The emitter region 12 is provided in contact with the gate trench portion 40 on the front surface 21 of the mesa portion 71. The emitter region 12 may be provided so as to extend from one of the two trench portions sandwiching the mesa portion 71 to the other one of the trench portions in the X axis direction. The emitter region 12 is also provided below the contact hole 54.

In addition, the emitter region 12 may or may not be in contact with the dummy trench portion 30. The emitter region 12 of the present example is in contact with the dummy trench portion 30.

The contact region 15 is a region of a second conductivity type, which is provided above the base region 14 and has a higher doping concentration than the base region 14. As an example, the contact region 15 of the present example is of the P+ type. The contact region 15 of the present example is provided on the front surface 21 of the mesa portion 71. The contact region 15 may be provided from one of the two trench portions sandwiching the mesa portion 71 to the other one of the trench portions in the X axis direction. The contact region 15 may or may not be in contact with the gate trench portion 40 or the dummy trench portion 30. The contact region 15 of the present example is in contact with the dummy trench portion 30 and the gate trench portion 40. The contact region 15 is also provided below the contact hole 54.

FIG. 18 shows an example of a cross section a-a' in FIG. 1A. The cross section a-a' is an XZ plane that passes through the emitter regions 12 in the transistor portion 70. In the cross section a-a', the semiconductor device 100 of the present example includes the semiconductor substrate 10, the interlayer dielectric film 38, the emitter electrode 52, and the collector electrode 24. The collector electrode 24 is an example of a back surface side metal layer provided in contact with the back surface 23 of the semiconductor substrate 10. The emitter electrode 52 is formed above the semiconductor substrate 10 and the interlayer dielectric film 38.

The drift region 18 is a region of the first conductivity type, which is provided in the semiconductor substrate 10. As an example, the drift region 18 of the present example is of the N− type. The drift region 18 may be a region that has remained without other doping regions being formed in the semiconductor substrate 10. That is, the doping concentration of the drift region 18 may be a doping concentration of the semiconductor substrate 10.

The buffer region 20 is a region of the first conductivity type, which is provided closer to the back surface 23 of the semiconductor substrate 10 than the drift region 18. As an example, the buffer region 20 of the present example is of the N type. The doping concentration of the buffer region 20 is higher than the doping concentration of the drift region 18. The buffer region 20 may function as a field stop layer which prevents a depletion layer extending from the lower surface side of the base regions 14 from reaching the collector region 22 of the second conductivity type. It is to be noted that the buffer region 20 may be omitted.

The collector region 22 is provided below the buffer region 20 in the transistor portion 70. The collector region 22 has the second conductivity type. As an example, the collector region 22 of the present example is of the P+ type.

The collector electrode 24 is formed on the back surface 23 of the semiconductor substrate 10. The collector electrode 24 is formed of a conductive material such as metal. The material of the collector electrode 24 may be the same as or different from the material of the emitter electrode 52.

The base region 14 is a region of the second conductivity type, which is provided above the drift region 18. The base region 14 is provided in contact with the gate trench portion 40. The base region 14 may be provided in contact with the dummy trench portion 30.

The emitter region 12 is provided above the base region 14. The emitter region 12 is provided between the base region 14 and the front surface 21. The emitter region 12 is provided in contact with the gate trench portion 40. The emitter region 12 may or may not be in contact with the dummy trench portion 30.

An accumulation region 16 is a region of the first conductivity type, which is provided closer to the front surface 21 of the semiconductor substrate 10 than the drift region 18. As an example, the accumulation region 16 of the present example is of the N+ type. It is to be noted that the accumulation region 16 does not need to be provided.

The accumulation region 16 is provided in contact with the gate trench portion 40. The accumulation region 16 may or may not be in contact with the dummy trench portion 30. The doping concentration of the accumulation region 16 is higher than the doping concentration of the drift region 18. An ion implantation dose amount of the accumulation region 16 may be $1.0\,E{+}12\,cm^{-2}$ or more and $1.0\,E{+}13\,cm^{-2}$ or less.

Alternatively, the ion implantation dose amount of the accumulation region 16 may be 3.0 E+12 cm$^{-2}$ or more and 6.0 E+12 cm$^{-2}$ or less. By providing the accumulation region 16, a carrier injection enhancement effect (IE effect) can be enhanced to reduce an ON voltage of the transistor portion 70.

One or more gate trench portions 40 and one or more dummy trench portions 30 are provided on the front surface 21. Each trench portion is provided from the front surface 21 to the drift region 18. In the region where at least any of the emitter region 12, the base region 14, the contact region 15, or the accumulation region 16 is provided, each trench portion also penetrates through these regions to reach the drift region 18. The configuration of the trench portion penetrating through the doping region is not limited to the one manufactured in the order of forming the doping region and then forming the trench portion. The configuration of the trench portion penetrating through the doping region also includes a configuration of the doping region being formed between the trench portions after forming the trench portions.

The gate trench portion 40 includes a gate trench, a gate dielectric film 42, and a gate conductive portion 44 formed on the front surface 21. The gate dielectric film 42 is formed to cover an inner wall of the gate trench. The gate dielectric film 42 may be formed by oxidizing or nitriding the semiconductor in the inner wall of the gate trench. The gate conductive portion 44 is formed on an inner side of the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The gate conductive portion 44 includes a region opposing the adjacent base region 14 on the mesa portion 71 side with the gate dielectric film 42 being interposed therebetween, in the depth direction of the semiconductor substrate 10. When a predetermined voltage is applied to the gate conductive portion 44, a channel is formed by an electron inversion layer on a surface layer of the base region 14 at a boundary in contact with the gate trench.

The dummy trench portion 30 may have the same structure as the gate trench portion 40. The dummy trench portion 30 includes a dummy trench, a dummy dielectric film 32, and a dummy conductive portion 34 formed on the front surface 21 side. The dummy dielectric film 32 is formed to cover an inner wall of the dummy trench. The dummy conductive portion 34 is formed inside the dummy trench and formed on an inner side of the dummy dielectric film 32. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided above the semiconductor substrate 10. The interlayer dielectric film 38 of the present example is provided in contact with the front surface 21. The emitter electrode 52 is provided above the interlayer dielectric film 38. In the interlayer dielectric film 38, one or more contact holes 54 for electrically connecting the emitter electrode 52 and the semiconductor substrate 10 are provided. The contact hole 55 and the contact hole 56 may similarly be provided so as to penetrate through the interlayer dielectric film 38. A film thickness of the interlayer dielectric film 38 is, for example, 1.0 μm, but is not limited to this.

The interlayer dielectric film 38 may be a silicon oxide film. The interlayer dielectric film 38 may be a BPSG (Boro-phospho Silicate Glass) film, may be a BSG (boro-silicate glass) film, or may be a PSG (Phosphosilicate glass) film. The interlayer dielectric film 38 may also include a high temperature silicon oxide (HTO: High Temperature Oxide) film.

The back surface side lifetime control region 151 may be provided in the transistor portion 70. It is to be noted that the back surface side lifetime control region 151 may be omitted. The back surface side lifetime control region 151 is a region where a lifetime killer has intentionally been formed by implanting an impurity inside the semiconductor substrate 10, or the like. As an example, the back surface side lifetime control region 151 is formed by implanting helium into the semiconductor substrate 10. The back surface side lifetime control region 151 may also be formed by implanting protons. By providing the back surface side lifetime control region 151, a turn-off time can be reduced, and by suppressing a tail current, losses during switching can be reduced.

The lifetime killer is a recombination center of carriers. The lifetime killer may be a lattice defect. For example, the lifetime killer may be a vacancy, a divacancy, a defect complex of these with elements configuring the semiconductor substrate 10, or dislocation. Alternatively, the lifetime killer may be a noble gas element such as helium and neon, a metal element such as platinum, or the like. An electron beam or a proton may be used for forming the lattice defect.

A lifetime killer concentration is a concentration of the recombination center of carriers. The lifetime killer concentration may be a lattice defect concentration. For example, the lifetime killer concentration may be a vacancy concentration of a vacancy, a divacancy, or the like, a defect complex concentration of these vacancies with elements configuring the semiconductor substrate 10, or a dislocation concentration. Alternatively, the lifetime killer concentration may be a chemical concentration of the noble gas element such as helium and neon, or a chemical concentration of the metal element such as platinum.

The back surface side lifetime control region 151 is provided closer to the back surface 23 than the center of the semiconductor substrate 10 in the depth direction of the semiconductor substrate 10. The back surface side lifetime control region 151 of the present example is provided in the buffer region 20. The back surface side lifetime control region 151 of the present example is provided on an entire surface of the semiconductor substrate 10 in the XY plane, and can be formed without using a mask. The back surface side lifetime control region 151 may be provided in a part of the semiconductor substrate 10 in the XY plane. An impurity dose amount for forming the back surface side lifetime control region 151 may be 0.5 E+10 cm$^{-2}$ or more and 1.0 E+14 cm$^{-2}$ or less, or may be 5.0 E+10 cm$^{-2}$ or more and 1.0 E+13 cm$^{-2}$ or less.

The back surface side lifetime control region 151 may be formed by an implantation from the back surface 23 side. Accordingly, it becomes easy to avoid an effect on the front surface 21 side of the semiconductor device 100. For example, the back surface side lifetime control region 151 is formed by irradiating helium and protons from the back surface 23 side. Herein, which of the front surface 21 side and the back surface 23 side the implantation is performed from for forming the back surface side lifetime control region 151 can be determined by acquiring a state of the front surface 21 side by an SRP method or a measurement of a leakage current.

Figure 2A:
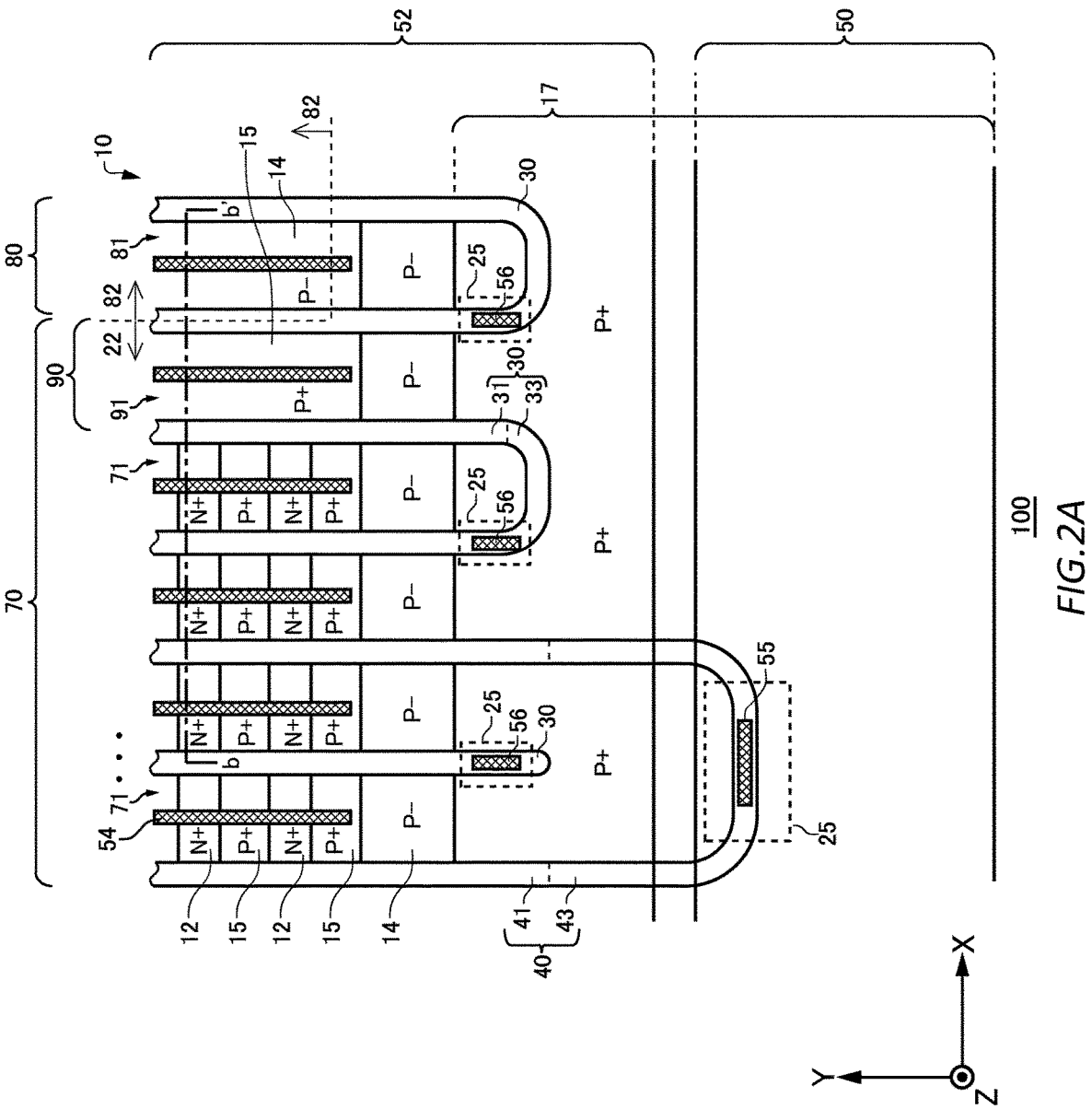
FIG. 2A shows a top view of a modified example of the semiconductor device 100.

FIG. 2A shows a top view of a modified example of the semiconductor device 100. The semiconductor device 100 of the present example includes the transistor portion 70 and a diode portion 80.

The diode portion 80 is a region obtained by projecting the cathode region 82 provided on the back surface 23 side of the semiconductor substrate 10 onto the upper surface of the semiconductor substrate 10. The semiconductor device 100 of the present example includes the gate trench portion 40, the dummy trench portion 30, the emitter region 12, the base region 14, the contact region 15, and the well region 17 that are provided inside the front surface 21 side of the semiconductor substrate 10. The gate trench portion 40 and the dummy trench portion 30 are each an example of the trench portion.

Similar to the gate trench portion 40, the dummy trench portion 30 of the present example may have a U shape on the front surface 21 of the semiconductor substrate 10. That is, the dummy trench portion 30 may include two extending portions 31 which extend along the extending direction and a connecting portion 33 which connects the two extending portions 31.

The semiconductor device 100 of the present example includes the emitter electrode 52 and the gate metal layer 50 provided above the front surface 21 of the semiconductor substrate 10. The emitter electrode 52 and the gate metal layer 50 are provided separate from each other. The transistor portion 70 of the present example includes a boundary portion 90 that is positioned at a boundary between the transistor portion 70 and the diode portion 80. It is to be noted that the semiconductor device 100 does not need to include the boundary portion 90.

The boundary portion 90 is a region that is provided in transistor portion 70 and is in direct contact with the diode portion 80. The boundary portion 90 includes the contact region 15. The boundary portion 90 of the present example does not include the emitter region 12. In one example, the trench portions in the boundary portion 90 are the dummy trench portions 30. The boundary portion 90 of the present example is arranged such that both ends thereof in the X axis direction become the dummy trench portions 30.

The contact hole 54 is provided above the base region 14 in the diode portion 80. The contact hole 54 is provided above the contact region 15 in the boundary portion 90. No contact hole 54 is provided above the well regions 17 provided at both ends in the Y axis direction.

A mesa portion 91 is provided in the boundary portion 90. The mesa portion 91 includes the contact region 15 on the front surface 21 of the semiconductor substrate 10. The mesa portion 91 of the present example includes the base region 14 and the well region 17 on a negative side of the Y axis direction.

A mesa portion 81 is provided in a region sandwiched between the dummy trench portions 30 adjacent to each other in the diode portion 80. The mesa portion 81 includes the base region 14 on the front surface 21 of the semiconductor substrate 10. The mesa portion 81 of the present example includes the base region 14 and the well region 17 on the negative side of the Y axis direction.

The emitter region 12 is provided in the mesa portion 71, but does not need to be provided in the mesa portion 81 and the mesa portion 91. The contact region 15 is provided in the mesa portion 71 and the mesa portion 91, but does not need to be provided in the mesa portion 81.

Figure 2B:
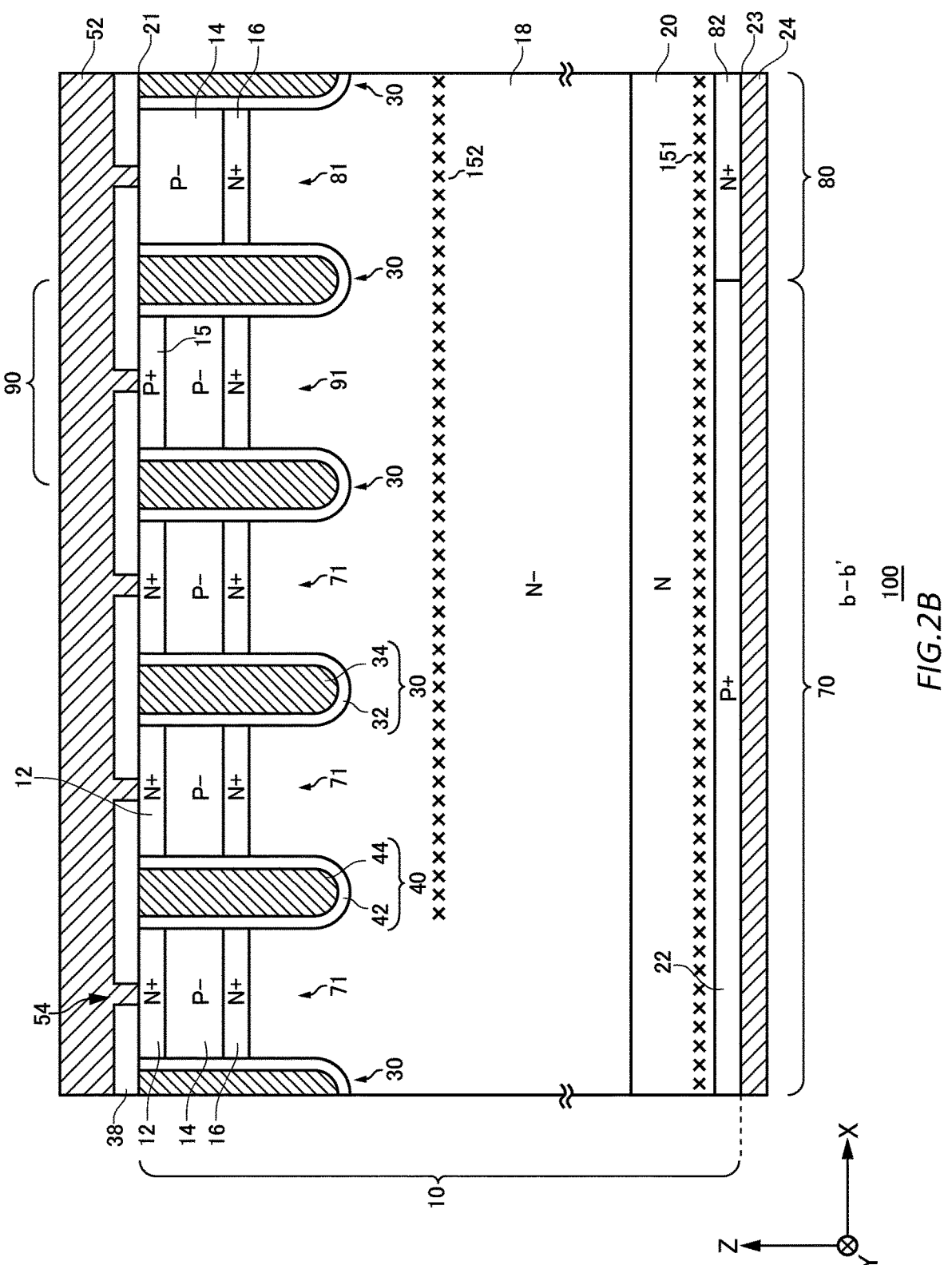
FIG. 2B shows a cross section b-b' of the modified example of the semiconductor device 100.

FIG. 2B shows a cross section b-b' of the modified example of the semiconductor device 100. The present figure corresponds to the cross section b-b' in FIG. 2A. The semiconductor device 100 of the present example includes the back surface side lifetime control region 151 and a front surface side lifetime control region 152. It is to be noted that the semiconductor device 100 does not need to include one of the back surface side lifetime control region 151 or the front surface side lifetime control region 152. The semiconductor device 100 of the present example includes the collector region 22 and the cathode region 82 on the back surface 23 side of the buffer region 20.

The contact region 15 is provided above the base region 14 in the mesa portion 91. The contact region 15 is provided in contact with the dummy trench portion 30 in the mesa portion 91. In another cross section, the contact region 15 may be provided on the front surface 21 of the mesa portion 71.

The accumulation region 16 is provided in the transistor portion 70 and the diode portion 80. The accumulation region 16 of the present example is provided on entire surfaces of the transistor portion 70 and the diode portion 80. It is to be noted that the accumulation region 16 does not need to be provided in the diode portion 80.

The cathode region 82 is provided below the buffer region 20 in the diode portion 80. A boundary between the collector region 22 and the cathode region 82 is a boundary between the transistor portion 70 and the diode portion 80. That is, the collector region 22 is provided below the boundary portion 90 of the present example.

The back surface side lifetime control region 151 is provided in both of the transistor portion 70 and the diode portion 80. Accordingly, in the semiconductor device 100 of the present example, a recovery speed in the diode portion 80 can be raised, and a switching loss can be further improved. The back surface side lifetime control region 151 may be formed by a method similar to that of the back surface side lifetime control region 151 in other examples.

The front surface side lifetime control region 152 is provided closer to the front surface 21 than the center of the semiconductor substrate 10 in the depth direction of the semiconductor substrate 10. The front surface side lifetime control region 152 of the present example is provided in the drift region 18. The front surface side lifetime control region 152 is provided in both of the transistor portion 70 and the diode portion 80. The front surface side lifetime control region 152 may be provided in the diode portion 80 and the boundary portion 90 and not be provided in a part of the transistor portion 70. With the front surface side lifetime control region 152, injection of holes from the diode portion 80 and the transistor portion 70 can be suppressed, and a reverse recovery loss can be reduced.

The front surface side lifetime control region 152 may be formed by any of the methods for forming the back surface side lifetime control region 151. The element, the dose amount, and the like for forming the back surface side lifetime control region 151 may be the same as or different from those for forming the front surface side lifetime control region 152.

The front surface side lifetime control region 152 is provided so as to extend from the diode portion 80 to the transistor portion 70. The front surface side lifetime control region 152 may be formed by an irradiation from the front surface 21 of the semiconductor substrate 10. The front surface side lifetime control region 152 may alternatively be formed by an irradiation from the back surface 23 side of the semiconductor substrate 10. The front surface side lifetime control region 152 of the present example is provided below the gate trench portion 40. Due to particle beams or the like for forming the front surface side lifetime control region 152 passing through the MOS gate structure of the semiconductor device 100, a defect may be generated at an interface between the gate oxide film and the semiconductor substrate.

The semiconductor device 100 may be a power semiconductor device for performing power control and the like. The semiconductor device 100 of the present example may have a vertical semiconductor structure in which a back surface side metal layer is provided on the back surface 23 side of the semiconductor substrate 10. It is to be noted that the semiconductor device 100 may alternatively have a horizontal semiconductor structure in which the metal layer is not provided on the back surface 23 side.

It is to be noted that in the present example, an RC-IGBT having a trench gate structure is described as an example of the semiconductor device 100. It is to be noted that the semiconductor device 100 may be a semiconductor device having a planar gate structure, or may be other semiconductor devices such as a diode.

Figure 3:
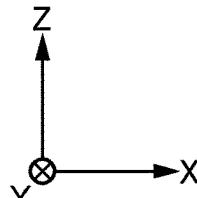
FIG. 3 is an enlarged diagram of a cross section of the semiconductor device 100.

FIG. 3 is an enlarged diagram of a cross section of the semiconductor device 100. In the present example, an enlarged diagram of a cross section in the vicinity of the contact hole 54 is shown. The semiconductor device 100 includes a first barrier metal layer 61, a second barrier metal layer 62, a silicide layer 63, and a plug layer 64.

It is to be noted that in the present specification, the contact hole 54 may be used to describe the structure in the vicinity of the contact hole, but similar structures may also be applied to other contact holes such as the contact hole 55 and the contact hole 56. That is, the first barrier metal layer 61, the second barrier metal layer 62, the silicide layer 63, and the plug layer 64 may also be provided in other contact holes such as the contact hole 55 and the contact hole 56.

The first barrier metal layer 61 is provided on side walls of the interlayer dielectric film 38 in the contact hole 54. The first barrier metal layer 61 includes a conductive material. For example, the first barrier metal layer 61 is formed of TiN. The first barrier metal layer 61 may be a hydrogen absorbing alloy. The first barrier metal layer 61 may contain, as metal that is apt to absorb hydrogen, any metal such as titanium (Ti), magnesium (Mg), vanadium (V), lanthanum (La), palladium (Pd), and zirconium (Zr). The first barrier metal layer 61 is formed by annealing an initial metal film formed of Ti or the like. The first barrier metal layer 61 of the present example is TiN formed by annealing Ti deposited on the side walls of the interlayer dielectric film 38 as the initial metal film in a nitrogen atmosphere.

The second barrier metal layer 62 is stacked on the first barrier metal layer 61 in the contact hole 54. The second barrier metal layer 62 includes a conductive material. For example, the second barrier metal layer 62 is formed of TiN. The second barrier metal layer 62 is provided by being stacked on the silicide layer 63 provided on the upper surface of the semiconductor substrate 10. The second barrier metal layer 62 may be formed by sputtering a conductive material. The second barrier metal layer 62 of the present example is TiN formed by sputtering.

The silicide layer 63 is provided on the upper surface of the semiconductor substrate 10 below the contact hole 54. The silicide layer 63 may be a titanium silicide layer. The silicide layer 63 is formed by annealing the initial metal film formed of Ti or the like. The silicide layer 63 of the present example is a titanium silicide layer formed by annealing Ti deposited on a bottom surface of the contact hole 54 as the initial metal film.

The first barrier metal layer 61 and the silicide layer 63 may be formed by the same annealing process. Accordingly, the first barrier metal layer 61 formed of TiN is formed on the side walls of the interlayer dielectric film 38, and the silicide layer 63 formed of titanium silicide is formed on the upper surface of the semiconductor substrate 10.

The plug layer 64 is provided in contact with the second barrier metal layer 62 in the contact hole 54. The plug layer 64 is a conductive material that is filled inside the contact hole 54. The material of the plug layer 64 may be different from that of the front surface side metal layer 53. For example, the material of the plug layer 64 is tungsten. It is to be noted that the plug layer 64 may be omitted so that the front surface side metal layer 53 is filled inside the contact hole 54. As will be described later, the plug layer 64 may infiltrate into the second barrier metal layer 62.

The interlayer dielectric film 38 includes the contact hole 54 and is provided above the semiconductor substrate 10. Although the interlayer dielectric film 38 includes one layer of a dielectric film provided above the front surface 21, the interlayer dielectric film 38 may alternatively include a plurality of stacked dielectric films. The interlayer dielectric film 38 may be a silicon oxide film such as BPSG.

The first barrier metal layer 61 is more dense than the second barrier metal layer 62. The first barrier metal layer 61 and the second barrier metal layer 62 may be formed by different deposition methods. The first barrier metal layer 61 may be a TiN film formed by annealing Ti deposited on the side walls of the interlayer dielectric film 38. The second barrier metal layer 62 may be a TiN film formed by sputtering TiN. Accordingly, the first barrier metal layer 61 may be a TiN film that is more dense than the second barrier metal layer 62. The first barrier metal layer 61 and the second barrier metal layer 62 may contain the same material.

By forming the first barrier metal layer 61 to be dense, the interlayer dielectric film 38 can be protected from a damage during deposition of the plug layer 64. On the other hand, since the initial metal film does not need to be formed for the second barrier metal layer 62 formed by the sputtering, an effect caused by a hydrogen absorbing effect due to remaining Ti or the like can be avoided. It is to be noted that since the second barrier metal layer 62 is not a dense film like the first barrier metal layer 61, the plug layer 64 may infiltrate into the second barrier metal layer 62 when forming the plug layer 64.

The film thickness of the first barrier metal layer 61 may be smaller than the film thickness of the second barrier metal layer 62. The film thickness of the first barrier metal layer 61 may be smaller than the film thickness of the silicide layer 63. The first barrier metal layer 61 may be thinned by etching performed after the formation of the dense film. The etching performed after the formation of the dense film may be performed using a chemical. The chemical used for performing the etching may be, for example, hydrofluoric acid, ammonia hydrogen peroxide, sulfuric acid, or the like. By the way, ammonia hydrogen peroxide is a mixture of ammonia ($NH_4OH$), hydrogen peroxide ($H_2O_2$), and water ($H_2O$). The etching performed after the formation of the dense film may be performed by a method such as dry etching or reverse sputtering. The film thickness of the first barrier metal layer 61 may be 1 nm or more and 10 nm or less. The film thickness of the first barrier metal layer 61 may be a film thickness at a thickest position in the contact hole 54. The film thickness of the first barrier metal layer 61 may be formed within a predetermined range on the entire side walls of the interlayer dielectric film 38. The film thickness of the second barrier metal layer 62 may be 1 nm or more and 100 nm or less. The film thickness of the silicide layer 63 may be 1 nm or more and 200 nm or less.

The first barrier metal layer 61 may cover the side walls of the interlayer dielectric film 38. A lower end of the first barrier metal layer 61 may be in contact with the silicide layer 63. Accordingly, a situation where the interlayer dielectric film 38 is eroded by gas during deposition of the plug layer 64 can be avoided.

An opening width W54 of the contact hole 54 is a width of the contact hole 54 in the trench array direction on the upper surface of the interlayer dielectric film 38. The opening width W54 of the contact hole 54 may be 100 nm or more and 1000 nm or less.

An elevation angle θ of the contact hole 54 may be of a size in a level at which the first barrier metal layer 61 and the second barrier metal layer 62 can be formed uniformly. The elevation angle θ may be an angle formed between the front surface 21 and the side wall of the interlayer dielectric film 38. Miniaturization is promoted as the elevation angle θ of the contact hole 54 becomes larger, and it becomes easy to uniformly form the first barrier metal layer 61 as the elevation angle θ of the contact hole 54 becomes smaller. The elevation angle θ of the contact hole 54 may be 70° or more and 90° or less.

Herein, when electron beams, particle beams, and the like for forming the lifetime control region pass through the MOS gate structure, a defect may be generated in the vicinity of an interface between the oxide film and the semiconductor layer in the MOS gate structure. Then, when metal such as Ti having a hydrogen absorbing effect exists in the vicinity of the MOS gate structure, hydrogen diffused in the gate portion may be absorbed so as to result in an inhibition of a hydrogen termination of a dangling bond of the MOS gate structure and a variation of a threshold voltage.

In the semiconductor device 100 of the present example, by thinning the first barrier metal layer 61 so as to reduce a remaining amount of metal such as Ti having a hydrogen absorbing effect, it is possible to suppress the effect caused by the hydrogen absorbing effect and promote the hydrogen termination of a dangling bond of the MOS gate structure. Accordingly, a variation of the threshold voltage can be suppressed. Moreover, by the semiconductor device 100 including the second barrier metal layer 62, even when the first barrier metal layer 61 is thinned, a barrier property during deposition of the plug layer 64 can be secured. Since the lifetime control region can be formed while suppressing the variation of the threshold voltage in the semiconductor device 100, a reverse recovery loss can be reduced.

It is to be noted that although an effect of the electron beams and particle beams for forming the lifetime control region on the MOS gate structure becomes large when irradiating the beams from the front surface 21 side of the semiconductor substrate 10, the beams may affect the MOS gate structure also when being irradiated from the back surface 23 side of the semiconductor substrate 10. Thus, also when irradiating from the back surface 23 side, the semiconductor device 100 can recover the damage of the MOS gate structure and suppress the variation of the threshold voltage. It is to be noted that although an acceleration voltage becomes large to result in an increase in the size of the device when irradiating particle beams and the like from the back surface 23 side of the semiconductor substrate 10, in the semiconductor device 100 of the present example, the effect of irradiating particle beams and the like from the front surface 21 can be suppressed, and thus the lifetime control region can be formed with a more compact device.

Figure 4:
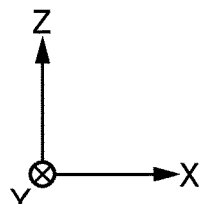
FIG. 4 is an enlarged diagram of a cross section of the semiconductor device 100 as a modified example.

FIG. 4 is an enlarged diagram of a cross section of the semiconductor device 100 as a modified example. The semiconductor device 100 of the present example differs from the semiconductor device 100 shown in FIG. 3 in the point of including a first dielectric film 138 and a second dielectric film 238. In the present example, different points from the semiconductor device 100 shown in FIG. 3 will be described in particular.

The first dielectric film 138 is provided above the semiconductor substrate 10. The first dielectric film 138 may be formed of a different material from the dielectric films such as the dummy dielectric film 32 and the gate dielectric film 42. In one example, the first dielectric film 138 is an HTO film. A film thickness of the first dielectric film 138 may be larger than the film thickness of the dummy dielectric film 32 and larger than the film thickness of the gate dielectric film 42. The film thickness of the first dielectric film 138 may be 50 nm or more and 500 nm or less.

The second dielectric film 238 is provided above the first dielectric film 138. The second dielectric film 238 may be formed of a different material from the first dielectric film 138. The second dielectric film 238 may be a silicon oxide film. The second dielectric film 238 may be a BPSG film, a BSG film, or a PSG film. A film thickness of the second dielectric film 238 may be larger than the film thickness of the first dielectric film 138. The film thickness of the second dielectric film 238 may be 500 nm or more and 1500 nm or less. By thickly stacking the second dielectric film 238, it becomes easy to eliminate steps on the upper surface of the semiconductor device 100 and make the surface uniform.

An elevation angle θ1 of the first dielectric film 138 may be the same as or different from an elevation angle θ2 of the second dielectric film 238. The elevation angle θ1 of the first dielectric film 138 may be larger than or smaller than the elevation angle θ2 of the second dielectric film 238. The elevation angle θ1 and the elevation angle θ2 may be set such that the film thickness of the first barrier metal layer 61 becomes uniform.

The contact hole 54 is provided so as to penetrate through the first dielectric film 138 and the second dielectric film 238. The contact hole 54 may have a constricted structure in the cross section. The film thickness of the first barrier metal layer 61 may be formed to be larger than that of side walls of the first dielectric film 138 and the second dielectric film 238 on an upper surface of the first dielectric film 138. In a direction parallel to the front surface 21 of the semiconductor substrate 10, an opening width W2 of the contact hole 54 provided in the second dielectric film 238 may be larger than an opening width W1 of the contact hole 54 provided in the first dielectric film 138.

Figure 5:
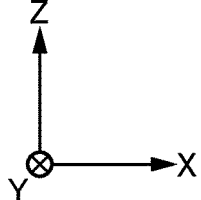
FIG. 5 is an enlarged diagram of a cross section of the semiconductor device 100 as a modified example.

FIG. 5 is an enlarged diagram of a cross section of the semiconductor device 100 as a modified example. The semiconductor device 100 of the present example differs from the semiconductor device 100 shown in FIG. 3 in the point of including a trench contact portion 65. In the present example, different points from the semiconductor device 100 shown in FIG. 3 will be described in particular.

The trench contact portion 65 includes the contact hole 54 and is provided so as to extend from the front surface 21 of the semiconductor substrate 10 in the depth direction of the semiconductor substrate 10. A lower end of the trench contact portion 65 may be shallower than a lower end of the emitter region 12. The lower end of the trench contact portion 65 may be deeper than the lower end of the emitter region 12. The lower end of the trench contact portion 65 may be shallower than an upper end of the gate conductive portion 44. The lower end of the trench contact portion 65 may be deeper than the upper end of the gate conductive portion 44.

The first barrier metal layer 61 is provided in contact with the side walls of the interlayer dielectric film 38. The first barrier metal layer 61 does not need to be provided below the front surface 21. The silicide layer 63 is provided in contact with the side walls of the semiconductor substrate 10 and the upper surface of the semiconductor substrate 10 in the trench contact portion 65. The second barrier metal layer 62 is provided by being stacked on the first barrier metal layer 61 provided on the side walls of the interlayer dielectric film 38. The second barrier metal layer 62 is provided by being stacked on the silicide layer 63 provided on the side walls of the semiconductor substrate 10.

It is to be noted that although the interlayer dielectric film 38 of the present example includes one layer of a dielectric film, the interlayer dielectric film 38 may alternatively include two layers of dielectric films, that is, the first dielectric film 138 and the second dielectric film 238. By providing the trench contact portion 65, the semiconductor device 100 of the present example can increase a contact area with the semiconductor substrate 10 and reduce a contact resistance. By providing the trench contact portion 65 in the transistor portion 70, extraction of holes becomes easy, and latch-up can be suppressed.

Figure 6:
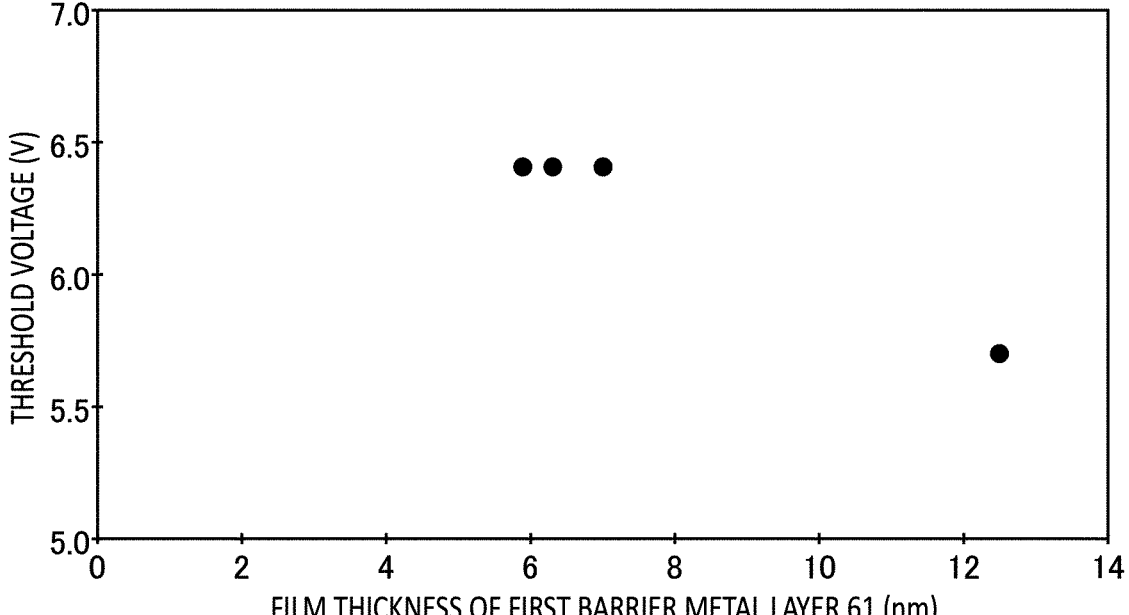
FIG. 6 shows a relationship between a film thickness of a first barrier metal layer 61 and a threshold voltage of the semiconductor device 100.

FIG. 6 shows a relationship between the film thickness of the first barrier metal layer 61 and the threshold voltage of the semiconductor device 100. A vertical axis represents the threshold voltage (V) of the semiconductor device 100. A horizontal axis represents the film thickness (nm) of the first barrier metal layer 61. In a range in which the film thickness of the first barrier metal layer 61 is 1 nm or more and 10 nm or less, the threshold voltage does not decrease, but when the film thickness exceeds 10 nm, the threshold voltage decreases. In this manner, when the film thickness of the first barrier metal layer 61 becomes large, a defect of the MOS gate structure does not recover and the threshold voltage is apt to decrease due to the hydrogen absorbing effect of the first barrier metal layer 61.

Figure 7:
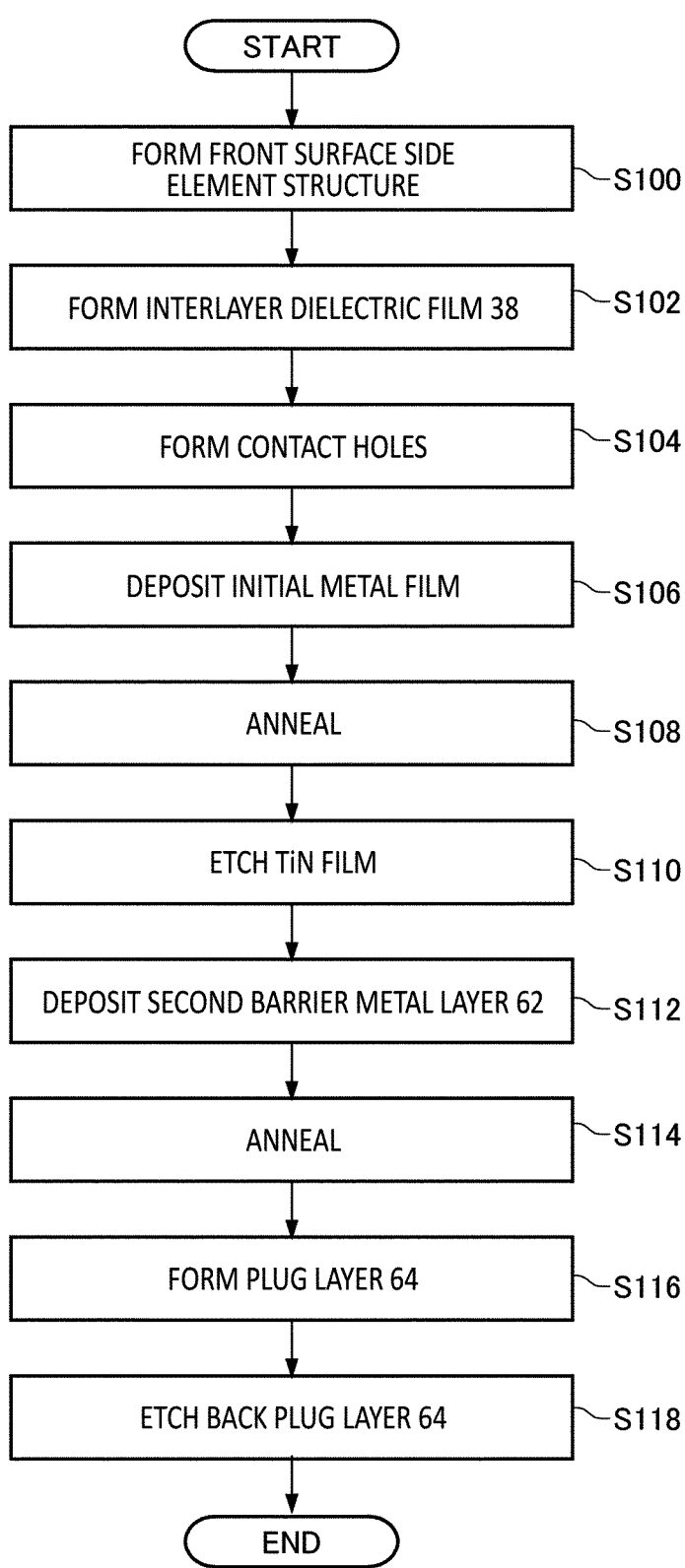
FIG. 7 is a flowchart showing an example of manufacturing processes of the semiconductor device 100.

FIG. 7 is a flowchart showing an example of manufacturing processes of the semiconductor device 100. In Step S100, an element structure on the front surface 21 side of the semiconductor device 100 is formed. Step S100 may include a process of forming the dummy trench portion 30 and the gate trench portion 40 as the element structure on the front surface 21 side. Step S100 may include a process of forming, as the element structure on the front surface 21 side, the base region 14, the emitter region 12, the contact region 15, and the like by performing ion implantation with respect to the semiconductor substrate 10.

In Step S102, the interlayer dielectric film 38 is formed above the semiconductor substrate 10. When the interlayer dielectric film 38 includes the first dielectric film 138 and the second dielectric film 238, both of the first dielectric film 138 and the second dielectric film 238 may be formed. In Step S104, the interlayer dielectric film 38 is etched to form contact holes. In Step S104, the contact holes such as the contact hole 54, the contact hole 55, and the contact hole 56 may be formed in the interlayer dielectric film 38.

In Step S106, an initial metal film for forming the first barrier metal layer 61 and the silicide layer 63 is deposited. In the present example, a predetermined initial metal film is formed on the side walls of the interlayer dielectric film 38 and the upper surface of the semiconductor substrate 10 in the contact hole 54. That is, the initial metal film is formed so as to be in contact with the interlayer dielectric film 38 and the semiconductor substrate 10. For example, the initial metal film is a Ti film deposited by sputtering. The film thickness of the initial metal film may be 1 nm or more and 100 nm or less.

In Step S108, the semiconductor substrate 10 is annealed in a nitrogen atmosphere. Accordingly, the first barrier metal layer 61 is formed on the side walls of the interlayer dielectric film 38, and the silicide layer 63 is formed on the upper surface of the semiconductor substrate 10. In this manner, the initial metal film in contact with the interlayer dielectric film 38 becomes the first barrier metal layer 61, and the initial metal film in contact with the semiconductor substrate 10 becomes the silicide layer 63. The first barrier metal layer 61 of the present example is a dense TiN film formed by annealing the Ti film on the side walls of the interlayer dielectric film 38. The silicide layer 63 of the present example is a titanium silicide film formed by annealing the Ti film on the upper surface of the semiconductor substrate 10. Although the present example describes a case where the TiN film is formed as the first barrier metal layer 61, when the material of the first barrier metal layer 61 is not TiN, an initial metal film formed of a different material may be deposited. An annealing temperature may be 300° C. or more and 1100° C. or less. The annealing for forming the first barrier metal layer 61 may be executed before forming the second barrier metal layer 62.

In Step S110, the dense TiN film is etched to adjust the first barrier metal layer 61 to have a predetermined film thickness. The first barrier metal layer 61 of the present example is etched so that the film thickness thereof becomes 1 nm or more and 10 nm or less.

In Step S112, the second barrier metal layer 62 is deposited. The second barrier metal layer 62 may be formed by being stacked on the first barrier metal layer 61 and the silicide layer 63. The second barrier metal layer 62 of the present example is a TiN film deposited by sputtering. The step of forming the second barrier metal layer 62 by stacking it on the first barrier metal layer 61 may be executed after the step of etching the first barrier metal layer 61.

In Step S114, the semiconductor substrate 10 is annealed in a nitrogen atmosphere. An annealing condition in Step S114 may be the same as or different from the annealing condition in Step S108. The annealing of the present example is executed after forming the second barrier metal layer 62. The annealing of the second barrier metal layer 62 may be executed before depositing the plug layer 64.

In Step S116, the plug layer 64 is formed. In the present example, tungsten is formed so as to fill inside the contact hole 54 by a CVD (Chemical Vapor Deposition) method. In Step S118, the plug layer 64 is etched back. Accordingly, an unnecessary tungsten film outside the contact hole 54 may be removed. The etch back may be performed by dry etching or CMP. At a time of removing the tungsten film, the first barrier metal layer 61 and the second barrier metal layer 62 on the interlayer dielectric film 38 may also be removed. The first barrier metal layer 61 and the second barrier metal layer 62 on the interlayer dielectric film 38 may be removed by a different process from the etch back of the plug layer 64.

After Step S118, the front surface side metal layer 53 may be formed above the semiconductor substrate 10. Further, after Step S118, the members on the back surface 23 side such as the collector electrode 24 may be formed. After Step S118, the back surface side lifetime control region 151 and the front surface side lifetime control region 152 may be formed.

Figure 8:
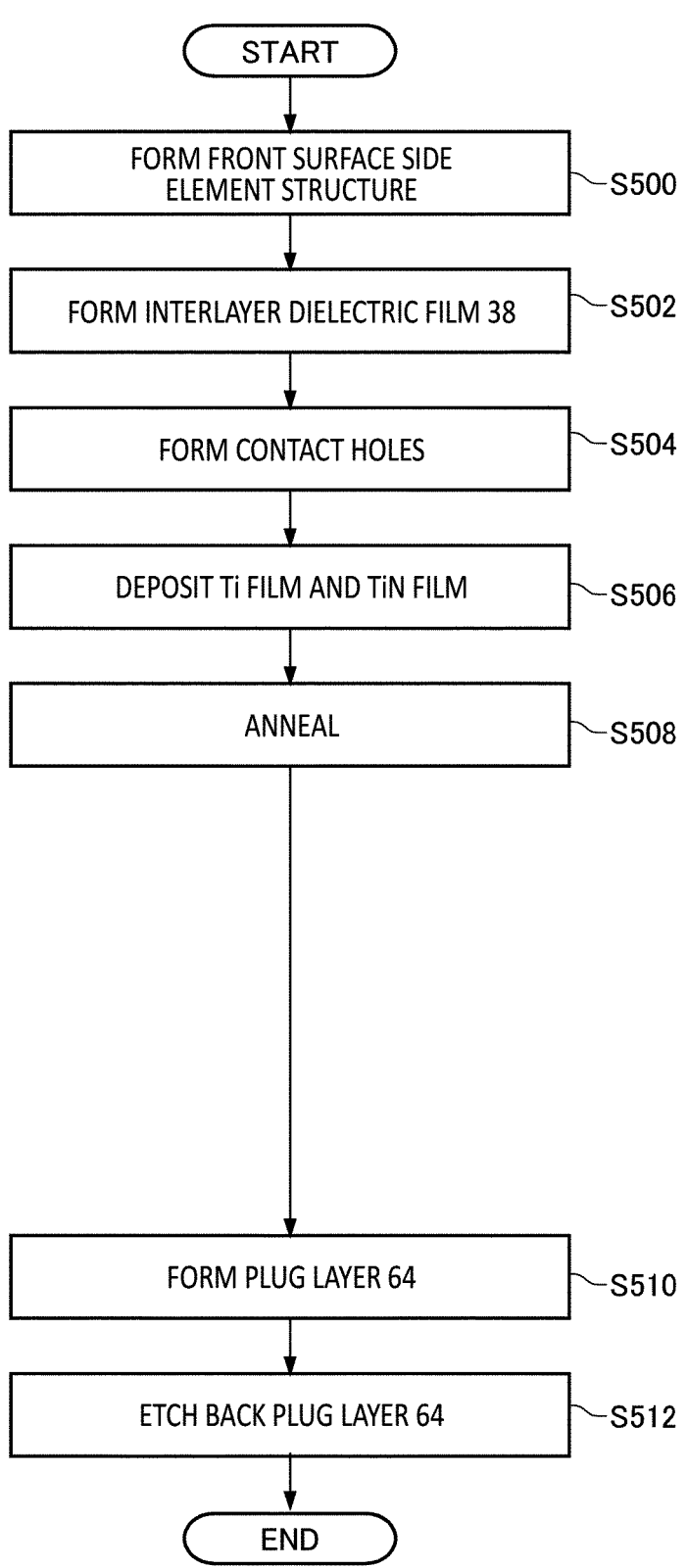
FIG. 8 is a flowchart showing manufacturing processes of a semiconductor device according to a comparative example.

FIG. 8 is a flowchart showing manufacturing processes of a semiconductor device according to a comparative example. The manufacturing processes of the semiconductor device according to the comparative example differ from those of the semiconductor device 100 shown in FIG. 7 in that a dense TiN layer is not thinned by etching. Step S500 to Step S504 may respectively correspond to Step S100 to Step S104 shown in FIG. 7.

In Step S506, a Ti film and a TiN film are deposited on an inner side of the contact hole. In Step S508, the semiconductor substrate 10 is annealed to form a dense TiN film from the Ti film on the side walls of the interlayer dielectric film 38. A titanium silicide layer is formed on the upper surface of the semiconductor substrate 10. In Step S510, the plug layer 64 is formed inside the contact hole. In Step S512, the plug layer 64 is etched back. The etch back may be performed by dry etching or CMP. At a time of removing the tungsten film, the first barrier metal layer 61 and the second barrier metal layer 62 on the interlayer dielectric film 38 may also be removed. The first barrier metal layer 61 and the second barrier metal layer 62 on the interlayer dielectric film 38 may be removed by a different process from the etch back of the plug layer 64.

Herein, for providing the dense TiN film on the entire surfaces of the side walls of the interlayer dielectric film 38, the Ti film needs to be deposited thickly with a margin so as not to cause unevenness in the TiN film. Since the dense TiN film on the side walls of the interlayer dielectric film 38 is not etched and the dense TiN film is formed to be thick in the semiconductor device of the comparative example, a defect may remain without the hydrogen termination of the MOS gate structure being caused by the hydrogen absorbing effect.

In contrast, since the first barrier metal layer 61 is thinned by etching in the semiconductor device 100, even when the initial metal film is uniformly formed to be thick, the first barrier metal layer 61 can be thinned so as to reduce remaining Ti. Accordingly, the defect around the MOS gate structure can be terminated by hydrogen to thus suppress the variation of the threshold voltage.

While the embodiment of the present invention has been described, the technical scope of the invention is not limited to the above-described embodiment. It is apparent to persons skilled in the art that various alterations and improvements can be added to the above-described embodiment. It is also apparent from the description of the claims that the embodiment to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: semiconductor substrate;
12: emitter region;
14: base region;
15: contact region;
16: accumulation region;
17: well region;
18: drift region;
20: buffer region;

21: front surface;
22: collector region;
23: back surface;
24: collector electrode;
25: connection portion;
30: dummy trench portion;
31: extending portion;
32: dummy dielectric film;
33: connecting portion;
34: dummy conductive portion;
38: interlayer dielectric film;
40: gate trench portion;
41: extending portion;
42: gate dielectric film;
43: connecting portion;
44: gate conductive portion;
50: gate metal layer;
52: emitter electrode;
53: front surface side metal layer;
54: contact hole;
55: contact hole;
56: contact hole;
61: first barrier metal layer;
62: second barrier metal layer;
63: silicide layer;
64: plug layer;
65: trench contact portion;
70: transistor portion;
71: mesa portion;
80: diode portion;
81: mesa portion;
82: cathode region;
90: boundary portion;
91: mesa portion;
100: semiconductor device;
138: first dielectric film;
151: back surface side lifetime control region;
152: front surface side lifetime control region;
238: second dielectric film.

What is claimed is:

1. A semiconductor device including a MOS gate structure provided in a semiconductor substrate, comprising:
   an interlayer dielectric film which includes a contact hole and is provided above the semiconductor substrate;
   a conductive first barrier metal layer provided on side walls of the interlayer dielectric film in the contact hole;
   a conductive second barrier metal layer stacked on the first barrier metal layer in the contact hole; and
   a silicide layer provided on an upper surface of the semiconductor substrate below the contact hole,
   wherein
   the first barrier metal layer is more dense than the second barrier metal layer, and a thickness of the first barrier metal layer is 1 nm or more and 10 nm or less, and
   the second barrier metal layer is provided by being stacked on the silicide layer provided on the upper surface of the semiconductor substrate, the second barrier metal layer and the silicide layer bordering each other.

2. The semiconductor device according to claim 1, wherein
   the first barrier metal layer is formed of TiN.

3. The semiconductor device according to claim 1, wherein
   a lower end of the first barrier metal layer is in contact with the silicide layer.

4. The semiconductor device according to claim 1, wherein
the film thickness of the first barrier metal layer is smaller than a film thickness of the second barrier metal layer.
5. The semiconductor device according to claim 1, comprising:
a plug layer provided in contact with the second barrier metal layer in the contact hole.
6. The semiconductor device according to claim 5, wherein
the plug layer infiltrates into the second barrier metal layer.
7. The semiconductor device according to claim 1, wherein
the interlayer dielectric film includes
a first dielectric film provided above the semiconductor substrate, and
a second dielectric film which is provided above the first dielectric film and has a larger film thickness than the first dielectric film.
8. The semiconductor device according to claim 7, wherein
the contact hole is provided so as to penetrate through the first dielectric film and the second dielectric film, and
an opening width of the contact hole provided in the second dielectric film is larger than an opening width of the contact hole provided in the first dielectric film in a direction parallel to a front surface of the semiconductor substrate.
9. The semiconductor device according to claim 1, comprising:
a trench contact portion which includes the contact hole and is provided so as to extend from a front surface of the semiconductor substrate in a depth direction of the semiconductor substrate.
10. The semiconductor device according to claim 9, wherein
the silicide layer is provided in contact with side walls of the semiconductor substrate and the upper surface of the semiconductor substrate in the trench contact portion.
11. The semiconductor device according to claim 9, wherein
the second barrier metal layer is provided by being stacked on the silicide layer provided on side walls of the semiconductor substrate.
12. The semiconductor device according to claim 1, comprising:
a transistor portion and a diode portion.
13. The semiconductor device according to claim 12, comprising:
a front surface side lifetime control region provided closer to a front surface of the semiconductor substrate than a center of the semiconductor substrate in a depth direction of the semiconductor substrate.

14. The semiconductor device according to claim 13, wherein
the front surface side lifetime control region is provided so as to extend from the diode portion to the transistor portion.
15. The semiconductor device according to claim 13, wherein
the front surface side lifetime control region is formed by irradiating a particle beam onto the semiconductor substrate.
16. The semiconductor device according to claim 1, comprising:
a back surface side metal layer provided in contact with a back surface of the semiconductor substrate.
17. A method of manufacturing a semiconductor device including a MOS gate structure provided in a semiconductor substrate, comprising:
forming an interlayer dielectric film including a contact hole above the semiconductor substrate;
forming a predetermined initial metal film on side walls of the interlayer dielectric film and an upper surface of the semiconductor substrate in the contact hole;
annealing the semiconductor substrate to form a first barrier metal layer on the side walls of the interlayer dielectric film and form a silicide layer on the upper surface of the semiconductor substrate; and
forming a conductive second barrier metal layer by stacking the second barrier metal layer on the first barrier metal layer in the contact hole,
wherein
the first barrier metal layer is more dense than the second barrier metal layer, and a thickness of the first barrier metal layer is 1 nm or more and 10 nm or less, and
the second barrier metal layer is provided by being stacked on the silicide layer provided on the upper surface of the semiconductor substrate, the second barrier metal layer and the silicide layer bordering each other.
18. The method of manufacturing the semiconductor device according to claim 17, comprising:
etching the first barrier metal layer,
wherein the forming the second barrier metal layer by stacking the second barrier metal layer on the first barrier metal layer is executed after the etching the first barrier metal layer.
19. The method of manufacturing the semiconductor device according to claim 17, wherein
the annealing for forming the first barrier metal layer is executed before forming the second barrier metal layer, and
the method of manufacturing comprises annealing the semiconductor substrate after forming the second barrier metal layer.

* * * * *